United States Patent [19]
Taniguchi

[11] Patent Number: 5,867,544
[45] Date of Patent: Feb. 2, 1999

[54] PHASE-LOCKED LOOP OSCILLATOR, AND MOVING-AVERAGE CIRCUIT, AND DIVISION-RATIO EQUALIZATION CIRCUIT SUITABLE FOR USE IN THE SAME

[75] Inventor: Atsuki Taniguchi, Kawasaki, Japan

[73] Assignee: Fujitsu Limited, Kanagwa, Japan

[21] Appl. No.: 398,570

[22] Filed: Mar. 3, 1995

[30] Foreign Application Priority Data

Mar. 4, 1994 [JP] Japan ................................ 6-034324

[51] Int. Cl.⁶ .................................................. H03D 3/24
[52] U.S. Cl. .......................... 375/376; 375/229; 327/147
[58] Field of Search ................................ 375/376, 373, 375/229; 331/2, DIG. 2, 1 A, 11; 327/147, 151

[56] References Cited

U.S. PATENT DOCUMENTS

| | | |
|---|---|---|
| 4,066,978 | 1/1978 | Cox, Jr. et al. . |
| 4,516,083 | 5/1985 | Turney . |
| 4,965,531 | 10/1990 | Riley . |
| 5,159,292 | 10/1992 | Canfield et al. . |
| 5,319,680 | 6/1994 | Port et al. ................... 375/376 |
| 5,392,315 | 2/1995 | Laud ........................... 375/232 |
| 5,534,822 | 7/1996 | Taniguchi ................... 331/2 |

FOREIGN PATENT DOCUMENTS

| | | |
|---|---|---|
| 57-83934 | 5/1982 | Japan . |
| 3-68232 | 3/1991 | Japan . |
| 2 122 822 | 1/1984 | United Kingdom . |

OTHER PUBLICATIONS

Electronics and Communications in Japan, vol. 73, No. 4, 1 Apr. 1990, New York, US, pp. 48–55, XP000149326, T. Inoue et. al., "Interference Suppression Using DPLL with Notch Frequency Characteristic", p. 49, col. 2, line 1—p. 50, col. 2, line 22; figure 1.

*Primary Examiner*—Temesghen Ghebretinsae
*Attorney, Agent, or Firm*—Helfgott & Karas, P.C.

[57] ABSTRACT

In a first phase-locked loop, a digital value corresponding to the mean frequency of an input clock signal is obtained. In a second phase-locked loop, the mean value of the phase difference of an output clock relative to the input clock is measured and is added to the digital value corresponding to the mean frequency, to obtain a control value. From this control value, a control signal for uniformly controlling a dual-modulus frequency divider is generated and supplied to the dual-modulus frequency divider. In a moving-average circuit, a selector selects input data when updating the contents of a serial latch circuit array, and selects an output of the serial latch circuit array when accumulating values. Values serially output from the latch circuit array for accumulation are successively added up using an adder and a latch circuit. In a division-ratio equalization circuit, a calculating circuit calculates quotients $a_0, a_1, a_2 \ldots a_m$ when the control value is expressed as $1/(a_0+1/(a_1+1/(a_2+ \ldots +1/a_m)) \ldots )$, and the quotients are set as division ratios in programmable frequency dividers connected in cascade, through which a reference clock signal is frequency-divided to obtain the control signal.

19 Claims, 13 Drawing Sheets

PHASE-LOCKED LOOP OSCILLATOR, AND MOVING-AVERAGE CIRCUIT, AND DIVISION-RATIO EQUALIZATION CIRCUIT SUITABLE FOR USE IN THE SAME

BACKGROUND OF THE INVENTION

1. Field of the Invention

The present invention relates to a phase-locked loop oscillator for generating an output clock signal synchronized to an input clock signal and substantially free from phase variations of the input clock, and also relates to a moving-average circuit, and a division-ratio equalization circuit, suitable for use in the same. More particularly, the invention relates to a phase-locked loop oscillator for generating, from a fixed-frequency oscillator output, an output clock signal synchronized to an input clock signal, and substantially free from phase variations of the input clock, by uniformly controlling a dual-modulus frequency divider that operates with a division ratio selected from two division ratios, and also relates to a moving-average circuit, and a division-ratio equalization circuit, suitable for use in the same.

2. Description of the Related Art

In synchronous multiplexing transmission systems such as SDH (synchronous digital hierarchy) and SONET (synchronous optical network) systems, a highly stable clock signal, that serves as a reference for network synchronization, is transmitted from a master station to a slave station, and further to the next slave station and so on. Each slave station receives the clock signal transmitted from the master station or from another slave station on the master station side, and generates a synchronized clock signal for transmission to the next slave station.

The phase-locked loop oscillator in each slave station must have phase lock characteristics that can suppress the jitter and wander contained in the clock signal input from the transmission channel and that allows a sufficiently stable clock signal to be transmitted to the next slave station. Generally, phase variations with a frequency greater than 10 Hz are defined as wander, and those with a frequency less than 10 Hz are defined as jitter.

In the case of synchronous networks provided by NTT (Nippon Telegram and Telephone Public Corp.), for example, since the networks are constructed so that synchronization is applied to a signal with a narrow bandwidth by using a high precision network synchronizing apparatus, narrow loop bandwidth phase-looked loop oscillators constructed from microprocessors are used.

On the other hand, since the clock is not always supplied from a high precision clock source in North America and other areas, it is required that while providing for a wide capture-frequency range, a highly stable output clock, that can meet the specifications, be supplied. Furthermore, since no special clock supply apparatus is incorporated, there is a need for a small-sized phase-locked loop oscillator that fits inside a transmitting apparatus.

The present inventors contemplate providing a phase-locked loop oscillator applicable to the latter system. More specifically, the phase-locked loop oscillator contemplated in the invention is aimed at satisfying the following requirements: capture-frequency range is±20 ppm; short-term stability is $5 \times 10^{-9}$, that is, the ratio of wander amplitude of output clock to wander amplitude of input clock is $5 \times 10^{-9}$ or less; resistance to jitter is 1.5 UI, 10–150 Hz, that is, the phase variation of the output clock is held within the specified value when jitter with amplitude 1.5 times the clock cycle is input within the frequency range of 10 to 150 Hz; and compactness.

One of the present inventors has previously proposed, in U.S. patent application Ser. No. 08/189,462, a phase-locked loop oscillator that can satisfy the above requirements. According to the proposed phase-locked loop oscillator, in a first phase-locked loop, the phase of the output obtained by dividing a fixed-frequency oscillator output by a dual-modulus frequency divider with a division ratio of N or N+1 is compared with the phase of an input clock signal; at each comparison, if there is a phase lag, the division ratio is set to N (advance control in the first loop), and conversely, if there is a phase lead, the division ratio is set to N+1 (delay control in the first loop). The number of advance control events is counted over a predetermined period of time, and the moving average of the count values is taken. The moving average value for the number of advance control events in the first loop corresponds to the mean frequency of the input clock signal. This moving average value is used to calculate control values for advance control and delay control in a second loop. In the second phase-looked loop, the same fixed-oscillator output used in the first phase-locked loop is frequency-divided by a second dual-modulus frequency divider. The output of the divider is phase-compared with the input clock; if there is a lag, the control value for the advance control is selected, and if there is a lead, the control value for the delay control is selected. A control signal for controlling the second dual-modulus frequency divider is created from the selected control value, and the control signal is supplied to the frequency divider.

As described above, in the previously proposed phase-locked loop oscillator, the input clock and output clock are phase-compared; however, only phase lag or phase lead information is reflected in the control, and the amount of phase difference is not measured and, therefore, is not reflected in the control.

Further, for the moving-average circuit for calculating the mean frequency and mean phase difference, a possible configuration would be to connect a required number of latch circuits in series and add the values latched in the latch circuits using adders (no dividers are needed if the required number is $2^n$). In this configuration, however, if the number of latch circuit stages is increased, the number of adder circuits required will also increase. For example, if the number of latch circuit stages is n and the number of bits is 20, then a number, (n−1), of 20-bit parallel adders will have to be provided.

In Japanese Patent Examined Publication No. 57-169874, there is proposed a configuration in which input values are cumulatively added in an endless manner and an input value delayed through a shift register by a predetermined number of samples is subtracted from the cumulative value, thereby achieving a required number of additions using one adder and one subtractor.

This configuration, however, has the problem that if a cumulative value is changed due to noise or other effects, the change will continue to affect the subsequent operations.

Furthermore, in the dual-modulus frequency divider capable of selecting one division ratio from two division ratios, since the control value is given in the form of a fraction with the denominator constant, that is, as the number of times one division ratio should be selected in the predetermined number of control events, a division-ratio equalization circuit needs to be provided which, based on the control value, performs control for the division ratio to be distributed at equally spaced intervals along the time axis so that the dual-modulus frequency divider outputs a clock signal free from jitter and wander.

SUMMARY OF THE INVENTION

It is a primary object of the present invention to provide a phase-locked loop oscillator whose characteristics are improved by making provision to measure the amount of phase difference between an input clock and an output clock and reflect it in performing control.

It is another object of the invention to provide a moving-average circuit that can perform necessary operations with a reduced number of adders and that is capable of recovering, by itself, from the effects of external disturbances by not allowing such effects to persist.

It is a further object of the invention to provide a division-ratio equalization circuit for generating, from a supplied control value, a control signal for uniformly controlling a dual-modulus frequency divider circuit.

According to the invention, there is provided a phase-locked loop oscillator comprising: means for obtaining a first digital value indicating a mean frequency of an input signal; means for obtaining a second digital value indicating a mean phase difference of an output signal relative to the input signal; means for calculating a control value on the basis of the first and second digital values; a dual-modulus frequency divider for generating the output signal by frequency-dividing a reference signal, the frequency divider being capable of operating with a division ratio selected from two division ratios in accordance with a control signal; and means for generating the control signal for controlling the dual-modulus frequency divider in accordance with the control value.

According to the invention, there is also provided a moving-average circuit comprising: a storage circuit for storing a predetermined number of successive numeric values, and for outputting in sequence all the numeric values stored therein each time the stored contents thereof are updated with entry of a new numeric value; and an accumulator circuit for successively adding up the numeric values serially output from the storage circuit, the accumulator circuit being cleared when the stored contents of the storage circuit is updated.

According to the invention, there is also provided a division-ratio equalization circuit for generating a control signal by which a dual-modulus frequency divider, capable of operating with a division ratio selected from two division ratios in accordance with a control signal, is controlled so that the division ratio is distributed at equally spaced intervals along the time axis in accordance with an input control value, comprising: a calculating circuit that, from the input control value, successively calculates quotients $a_0$, $a_1$, $a_2$ ... $a_m$ for output, when the control value is expressed as $1/(a_0+1/(a_1+1/(a_2+ \ldots +1/a_m)) \ldots )$, and a control signal generating circuit that includes a cascaded chain of a plurality of programmable frequency dividers in which the plurality of quotients $a_0$, $a_1$, $a_2$ ... $a_m$ are set as respective division ratios, and that frequency-divides a reference signal through the cascaded chain of the plurality of programmable frequency dividers and outputs the result as the control signal.

DESCRIPTION OF THE PREFERRED EMBODIMENTS

Figure 1:
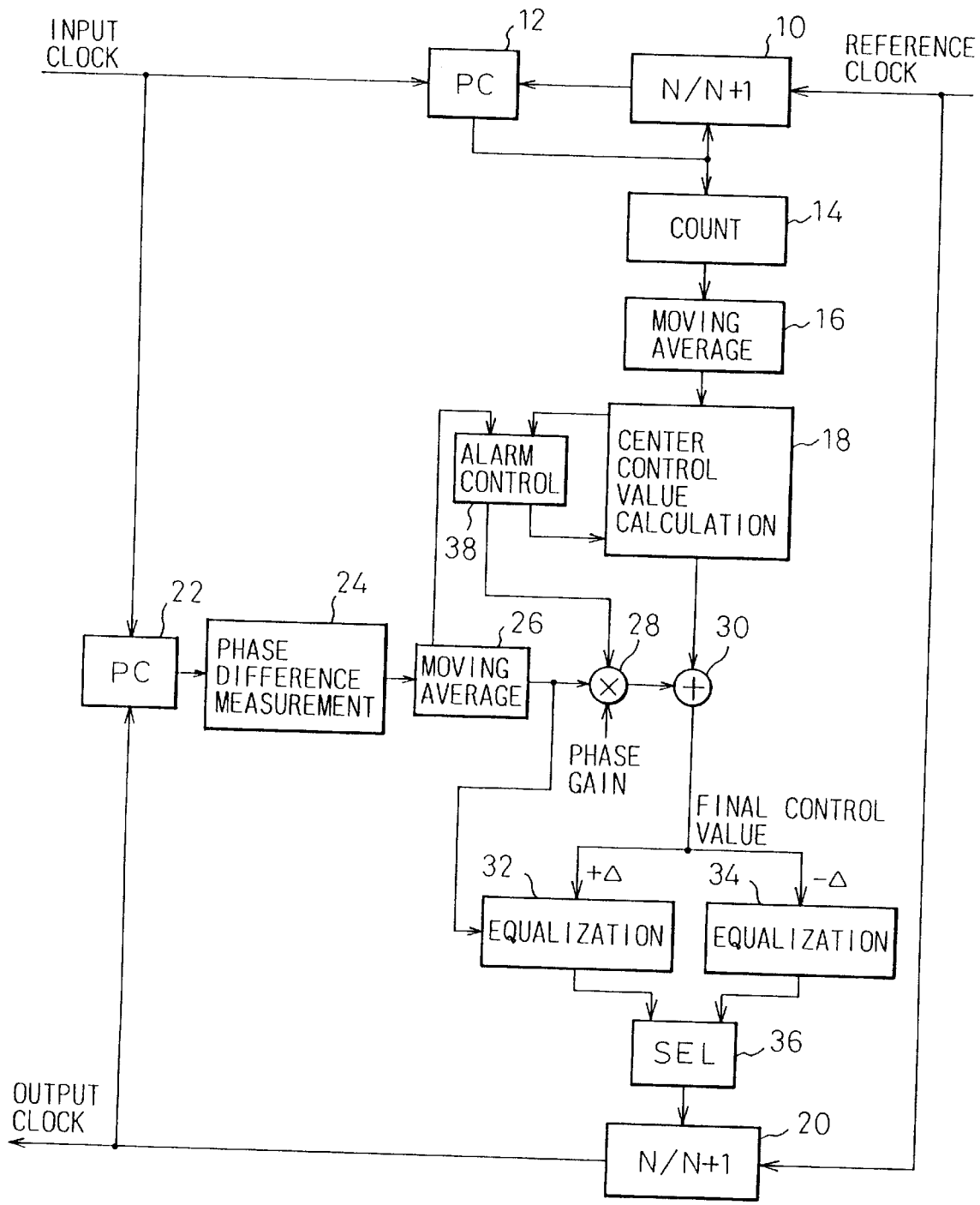
FIG. 1 is a block diagram of a phase-locked loop oscillator according to the present invention.

FIG. 1 shows a simplified schematic of a phase-locked loop oscillator according to the present invention.

A reference clock signal (for example, a 51.84-MHz signal) from a reference oscillator (not shown) is frequency-divided by a dual-modulus frequency divider 10 whose division ratio is set to either N or N+1 (N is an integer, for example, 33) in accordance with a control signal. The output of the frequency divider 10 is phase-compared in a phase comparator 12 with an input clock signal (for example, a 1.544-MHz signal); at each comparison, if there is a phase lag, the division ratio of the frequency divider 10 is set to N (advance control), and if there is a phase lead, it is set to N+1 (delay control). In the meantime, the number of advance control events (or delay control events) during a predetermined period of time (for example, 0.5 second) is counted by a counter circuit 14. If the operating clock frequency of the phase comparator 12 (for example, the output of the frequency divider 10 is used) is taken as the reference for time, the total number of advance control and delay control events during the predetermined period of time is constant (in the above example, 772,000); therefore, it is only necessary to count the number of events of one or the other of the two control types (in this example, the number of advance control events is counted). The number of advance control events counted by the counter circuit 14 is fed to a moving-average circuit 16 which calculates the moving average, for example, over 16 seconds, i.e., over 32 successive samples. Here, since the number of advance control events corresponds to the frequency of the input clock signal, the moving average of the number of advance control events corresponds to the mean frequency of the input clock signal. The center control value for the number of advance control events is calculated by a center control value calculator 18 from the moving average value for the number of advance control events supplied from the moving-average circuit 16.

Details of the center control value calculation will be described later.

The reference clock signal is also input to a frequency divider 20, which has the same configuration as the frequency divider 10. The input clock frequency is divided, as in the frequency divider 10, and the output of the frequency divider 20 is fed to a phase comparator 22 for phase comparison with the input clock signal. The phase comparator 22 outputs a pulse indicating an advance period or delay period. With these pulses as a gate signal, a phase difference measuring circuit 24 counts master clock pulses and produces a digital signal indicating a phase difference. The values of the phase differences output from the phase difference measuring circuit 24 are fed into a moving-average circuit 26 for calculation of the moving average. The result is multiplied in a gain controller 28 by a "phase gain". The result of the multiplication is fed to an adder 30 where it is added to the center control value output from the center control value calculator 18, and the final control value for the number of advance control events is obtained. To smooth the control by performing control with low gain at frequent intervals, a constant Δ (for example, 3) is added to or subtracted from the final control value, and the respective results are supplied to division-ratio equalization circuit 32 and 34 which generate respective control signals. Then, in a selector 36, a −Δ signal is selected when the mean phase difference is positive, and a +Δ signal when it is negative and the thus selected control signal is applied to the frequency divider 20. Not just two control values, −Δ and +Δ, but three or more control values may be precalculated and made available for selection. An alarm control circuit 38 detects an out-of-synchronization alarm, and when the alarm is detected, control is based only on the mean frequency.

Figure 2:
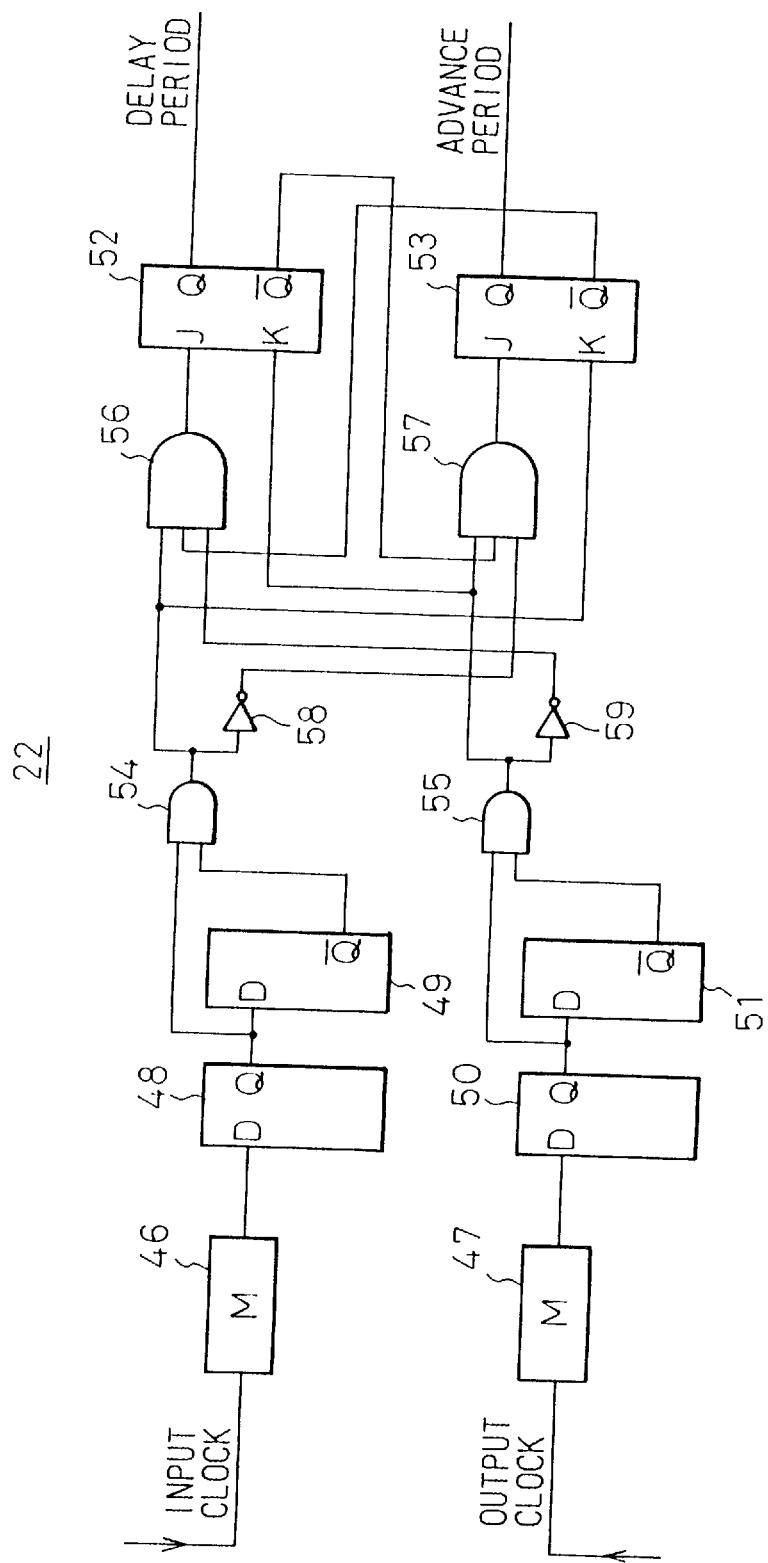
FIG. 2 is a circuit diagram of a phase comparator 22 in FIG. 1.

FIG. 2 shows the configuration of the phase comparator 22. To reduce the effects of the jitter and wander contained in the input clock, the frequencies of the input clock and output clock (for example, 1.544 MHz) are first divided by M (for example, 16) in frequency dividers 46 and 47 respectively, and then, their phases are compared. D flip-flops 48–51, JK flip-flops 52 and 53, AND gates 54–57, and inverters 58 and 59 constitute a known synchronous-type phase comparator. A synchronous-type phase comparator is employed here for stable circuit operation.

When the output clock is delayed in phase with respect to the phase of the input clock, a pulse is output from the JK flip-flop 52 during the interval from the rising of the input clock to the rising of the output clock. Conversely, when the output clock is advanced in phase with respect to the phase of the input clock, a pulse is output from the JK flip-flop 53 during the interval from the rising of the output clock to the rising of the input clock.

Figure 3:
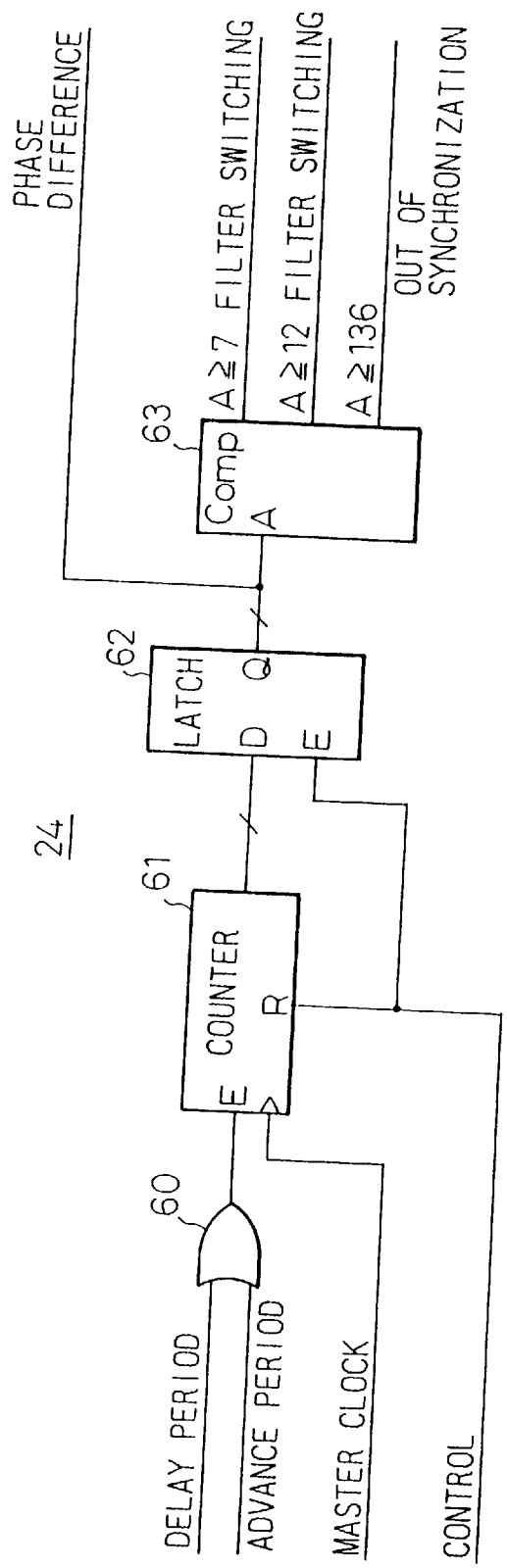
FIG. 3 is a circuit diagram of a phase difference measuring circuit 24 in FIG. 1.

FIG. 3 shows the configuration of the phase difference measuring circuit 24. Since the delay period pulse and the advance period pulse do not occur simultaneously, the two outputs are ORed by an OR gate 60 whose output is fed to a counter 61. This configuration allows the use of only one counter to serve the purpose. Using the signal from the OR gate 60 as a gate signal, the counter 61 counts master clock pulses (for example, 51.84 MHz) to measure the amount of the phase difference. The count value of the counter 61 is fed into a latch 62 by the control signal synchronized to the phase comparison timing, after which the counter 61 is reset. Since the measured phase difference value output from the phase difference measuring circuit 24 is given in the form of an absolute value without a positive or negative sign, addition is performed in the moving-average circuit 26 at the subsequent stage (see FIG. 1) by appending an appropriate sign. To save memory, the moving average is calculated after performing integration over a period of 4,096 samples (equivalent to 0.0424 second). Since the measured phase difference value latched in the latch 62 corresponds to an instantaneous value of the jitter amplitude, it is compared in a comparator 63 with constant values. Signals designated A≧7 and A≧12 indicate that the phase error is 100 ns or greater and 200 ns or greater, respectively, when the master clock is 51.84 Mhz; these signals are used for switching the number of moving-average samples in the moving-average circuit 26, as will be described later. Signal designated A≧136 indicates that the phase error is 2585 ns (which corresponds to 0.25 UI); this signal is used for detection of an out-of-synchronization condition.

Figure 4:
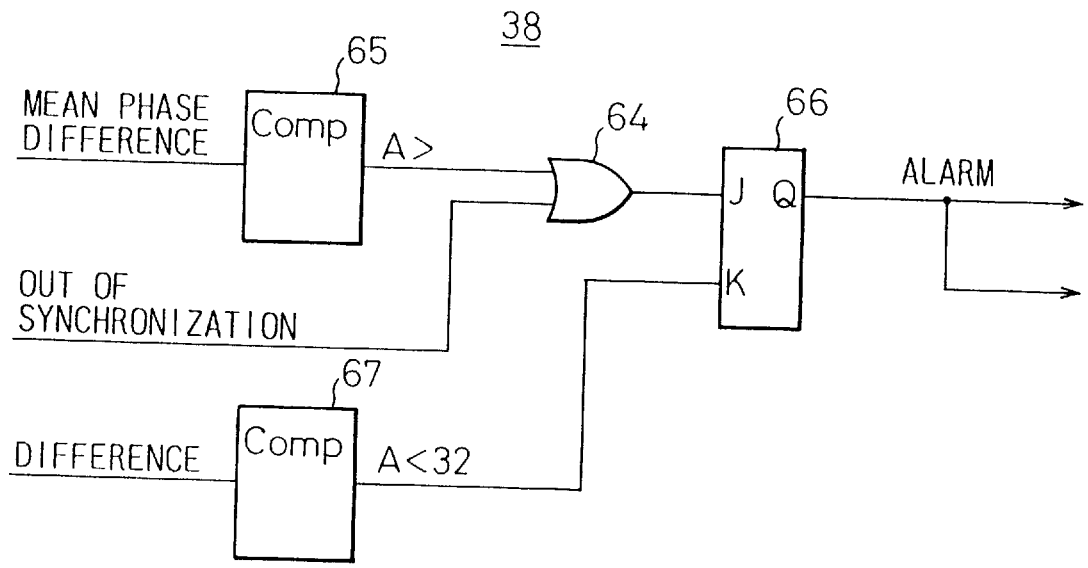
FIG. 4 is a circuit diagram of an alarm control circuit 38 in FIG. 1.

FIG. 4 illustrates the configuration of the alarm control circuit 38 shown in FIG. 1. The instantaneous out-of-synchronization signal described with reference to FIG. 3 is applied to one input of an OR gate 64. The mean phase difference value output from the moving-average circuit 26 (FIG. 1) is compared in a comparator 65 with a predetermined value, and the result is fed to the other input of the OR gate 64. Thus, when an instantaneous out-of-synchronization condition is detected, or when the mean phase difference exceeds a predetermined value, the output of the OR gate 64 goes high, which causes a JK flip-flop 66 to change state and output an alarm condition. When the difference (to be described later) between the moving average value and the center control value for the mean frequency falls below a predetermined value, it is determined that synchronization with the input clock is achieved, and the output of a comparator 67 is set to a high level, thus resetting the alarm condition.

Figure 5:
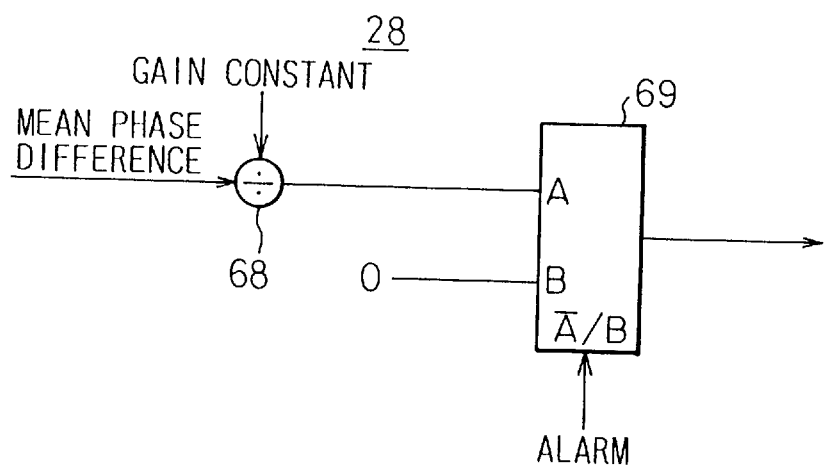
FIG. 5 is a circuit diagram of a gain controller 28 in FIG. 1.

FIG. 5 shows the configuration of the gain controller 28 (FIG. 1). The mean phase difference output from the moving-average circuit 26 is input to a divider 68 which divides it by a predetermined gain constant and outputs the result to a selector 69. Since the division is supposed to provide an integer value, the result is 0 when the mean phase difference is smaller than the gain constant. When no alarm is issued, the selector 69 selects the result of the division for output to the adder 30 (FIG. 1). When an alarm occurs, since the value of the mean phase difference does not have any meaning, the selector 69 selects a value "0", so that control is performed only by the mean frequency. At this time, the data within the moving-average circuit 26 is cleared.

Figure 6:
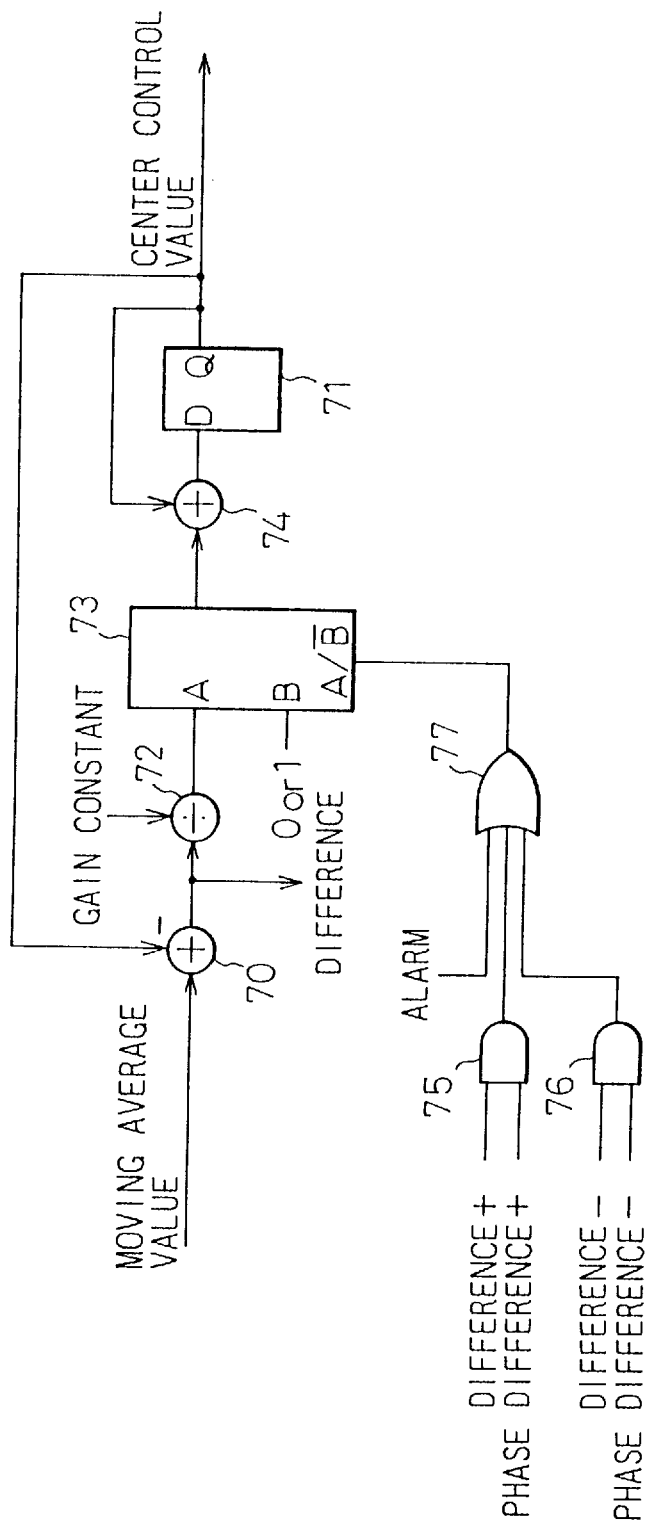
FIG. 6 is a circuit diagram of a center control value calculator 18 in FIG. 1.

FIG. 6 shows the configuration of the center control value calculator 18 (FIG. 1). In a subtractor 70, the difference between the moving average value supplied from the moving-average circuit 16 (FIG. 1) and the previous center control value latched in a latch circuit 71 is calculated, and is fed to a divider 72 where the difference is divided by a predetermined gain constant. When the difference value is smaller than the gain constant, the result is replaced by 1. The result of the division is fed to one input of a selector 73. A constant 0 or 1 is applied at the other input of the selector 73. The value selected by the selector 73 is added in an adder 74 to the previous center control value and then fed to the latch circuit 71. A signal indicating that the difference value is positive and a signal indicating that the mean phase difference is positive are input to an AND gate 75, while a signal indicating that the difference value is negative and a signal indicating that the mean phase difference is negative are input to an AND gate 76. The outputs of the AND gates 75 and 76 are input to an OR gate 77. An alarm signal is applied to the remaining input of the OR gate 77. The output of the OR gate 77 is sent to the selector 73 as a control signal.

The operation of the circuit shown in FIG. 6 will be described below. When the out-of-synchronization alarm is detected, the output of the OR gate 77 goes high, so that the selector 73 selects the output of the divider 72. At this time, since control by the mean phase difference has been rendered inoperative, the center control value output from the center control value calculator 18 is directly supplied as the final control value. Accordingly, when the out-of-synchronization alarm is detected, control is performed in such a manner that the final control value progressively approaches the mean frequency calculated by the moving-average circuit 16. This achieves quick and smooth capturing with a wide rage. When the difference between the moving average value and the center control value falls below the predetermined value, the alarm condition is reset, and control is performed according to the mean phase difference and the mean frequency. At this time, if a contradiction arises between the control by the frequency difference and the control by the mean phase difference, the outputs of the AND gates 75 and 76 both go low, and hence, the output of the OR gate 77 is low, so that the selector 73 selects the constant 0 or 1. In other words, when synchronization is established, if there occurs a contradiction between the direction of control by the mean frequency and the direction of control by the mean phase difference, control by the mean phase difference takes precedence.

Figure 7:
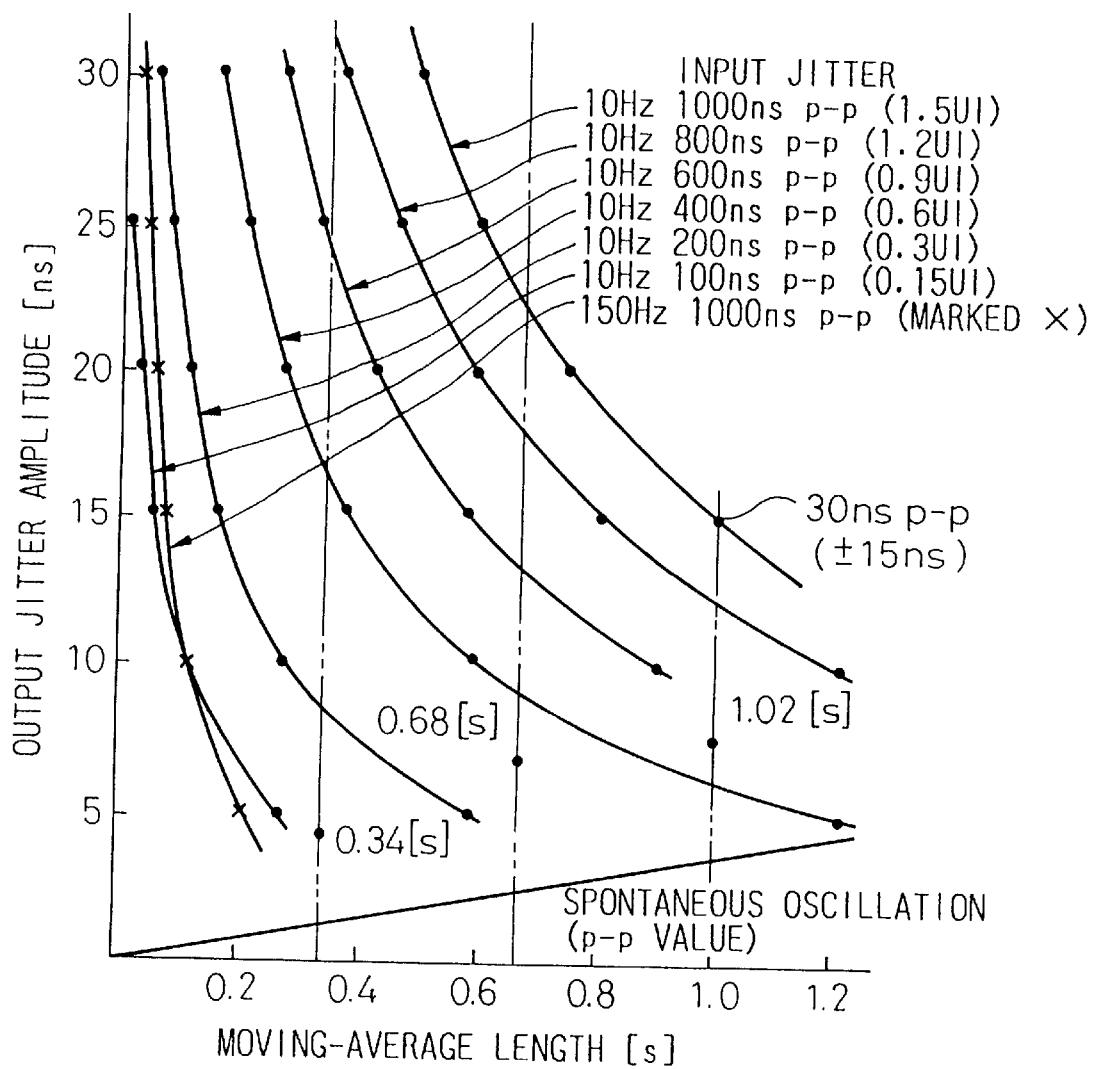
FIG. 7 is a graph showing the relationship between moving-average sample length and jitter output when jitters of various magnitudes are input.

Since control by the mean phase difference takes precedence when synchronization is established, in considering the jitter/wander suppression characteristics of the phase-locked loop oscillator of the present invention it will be effective to consider the relationship between the output jitter/wander and the moving-average sample length of the moving-average circuit 26 for calculating the mean phase difference. FIG. 7 shows a plot of the amplitude of jitter, appearing at the output for input jitter of various magnitudes, as a function of the moving-average sample length. The graph of FIG. 7 was obtained by computer simulation. As is apparent from FIG. 7, the effect of jitter suppression increases as the moving-average sample length is made longer; specifically, it can be seen that at the inoving-average sample length of 1.02 seconds, jitter of 1.5 UI is suppressed to 30 ns p-p. However, as shown in the lower part of the graph, the amplitude of wander due to the spontaneous oscillation caused by the moving average calculation increases linearly with increasing moving-average sample length. Accordingly, it is desirable to vary the moving-average sample length in accordance with the amplitude of input jitter.

Figure 8:
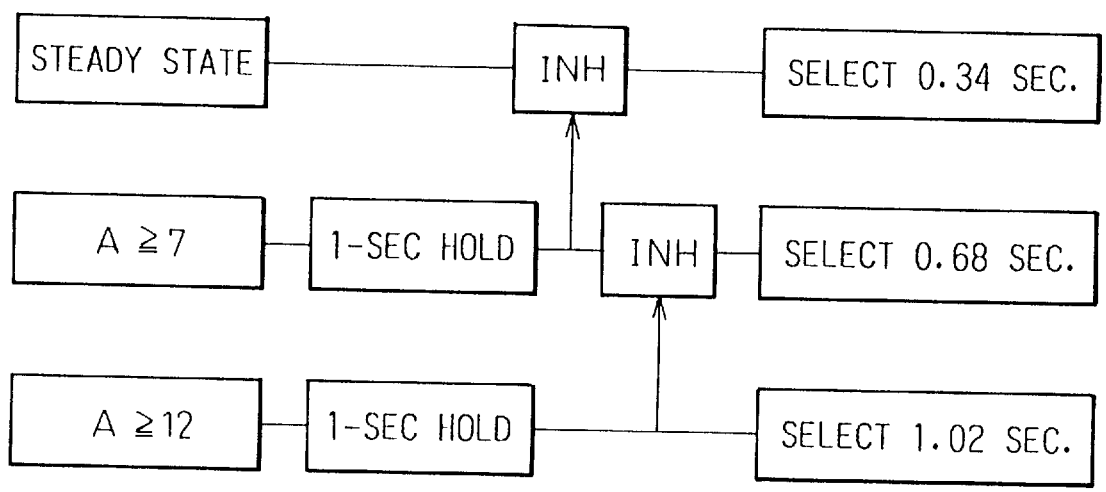
FIG. 8 is a conceptual diagram for explaining moving-average sample length control.

FIG. 8 shows the design of the moving-average sample length control based on the above concept. In steady state, 0.34 second is selected for the moving-average sample length. If it is judged by the comparator 63 of FIG. 3 that the phase difference measured value is 7 or greater (which corresponds to input jitter of 0.3 UI or greater), the selection of 0.34 second is inhibited and 0.68 second is selected. Once 0.68 second has been selected, even if the phase difference measured value falls below 7 the selection does not switch back to the shorter length instantaneously but remains at 0.68 second for one second. If it is judged that the phase difference measured value is 12 or greater (which corresponds to input jitter of 0.6 UI or greater), the selection of 0.68 second is inhibited and 1.02 seconds is selected. Likewise, once 1.02 seconds has been selected, even if the phase difference measured value falls below 12 the selected value is held for one second. As previously described, when the phase difference measured value is 136 or greater, it is judged to be an out-of-synchronization condition.

In the above example, the moving-average sample length is controlled based on the amplitude of input jitter, but alternatively, control may be performed on the basis of the frequency of input jitter in such a manner as to increase the moving-average sample length when the jitter frequency is low. The input jitter frequency can be measured by detecting zero-cross points of the phase difference measured valne. In this case, since there is a possibility of erroneous detection of zero-cross points when the phase difference is very small, hysteresis is introduced in the detection.

Figure 9:
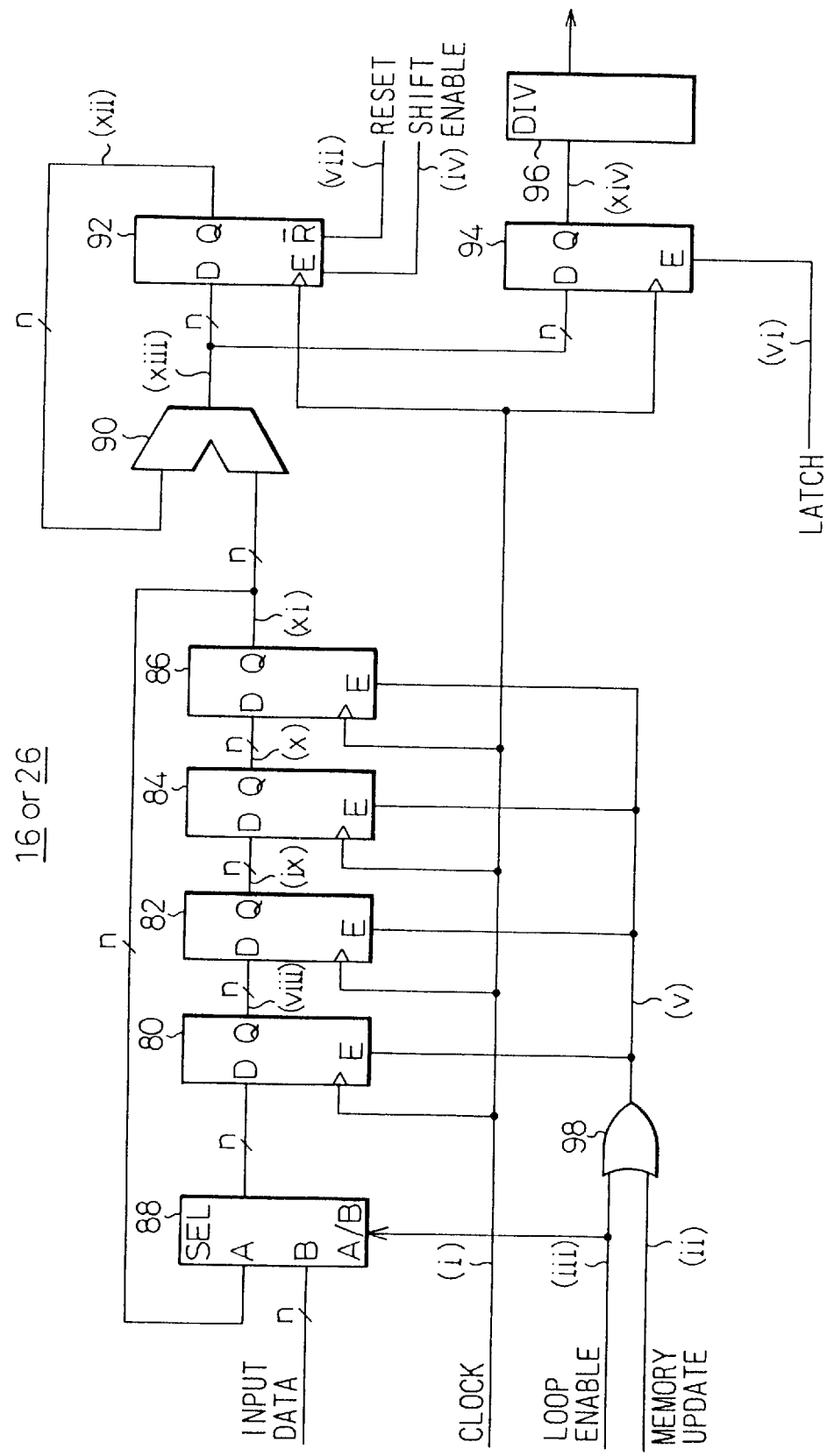
FIG. 9 is a circuit diagram showing the configuration of a moving-average circuit according to the present invention.

FIG. 9 shows the detailed configuration of the moving-average circuit 16 or 26 according to the present invention. For simplicity of explanation, the circuit shown here is for calculating the moving average of four successive samples.

Four n-bit latch circuits 80, 82, 84, and 86 are connected in series. An input of tha first-stage circuit 80 is connected to the output of a selector 88, and the output of the final-stage circuit 86 is connected to one input ("A" input) of the selector 88. The other input ("B" input) of the selector 88 is connected to an input data line. The output of the final-stage circuit 86 is also connected to one input of an adder 90. The output of the adder 90 is connected to an input of an n-bit latch circuit 92 whose output is connected to the other input of the adder 90. The output of the adder 90 is also connected to an n-bit latch circuit 94 whose output is connected to a divider 96. A loop-enable signal line is connected to a select input of the selector 88. The loop-enable signal line is also connected to an input of an OR gate 98 whose other input is connected to a memory-update signal line, The output of the OR gate 98 is connected to an enable input of each of the n-bit latch circuits 80, 82, 84, and 86. A reset input and an enable input of the n-bit latch circuit 92 are connected to a reset signal line and a shift-enable signal line, respectively. An enable input of the n-bit latch circuit 94 is connected to a latch signal line. Clock inputs of the n-bit latch circuits 80, 82, 84, 86, and 92 are connected to a clock signal line.

Figure 10:
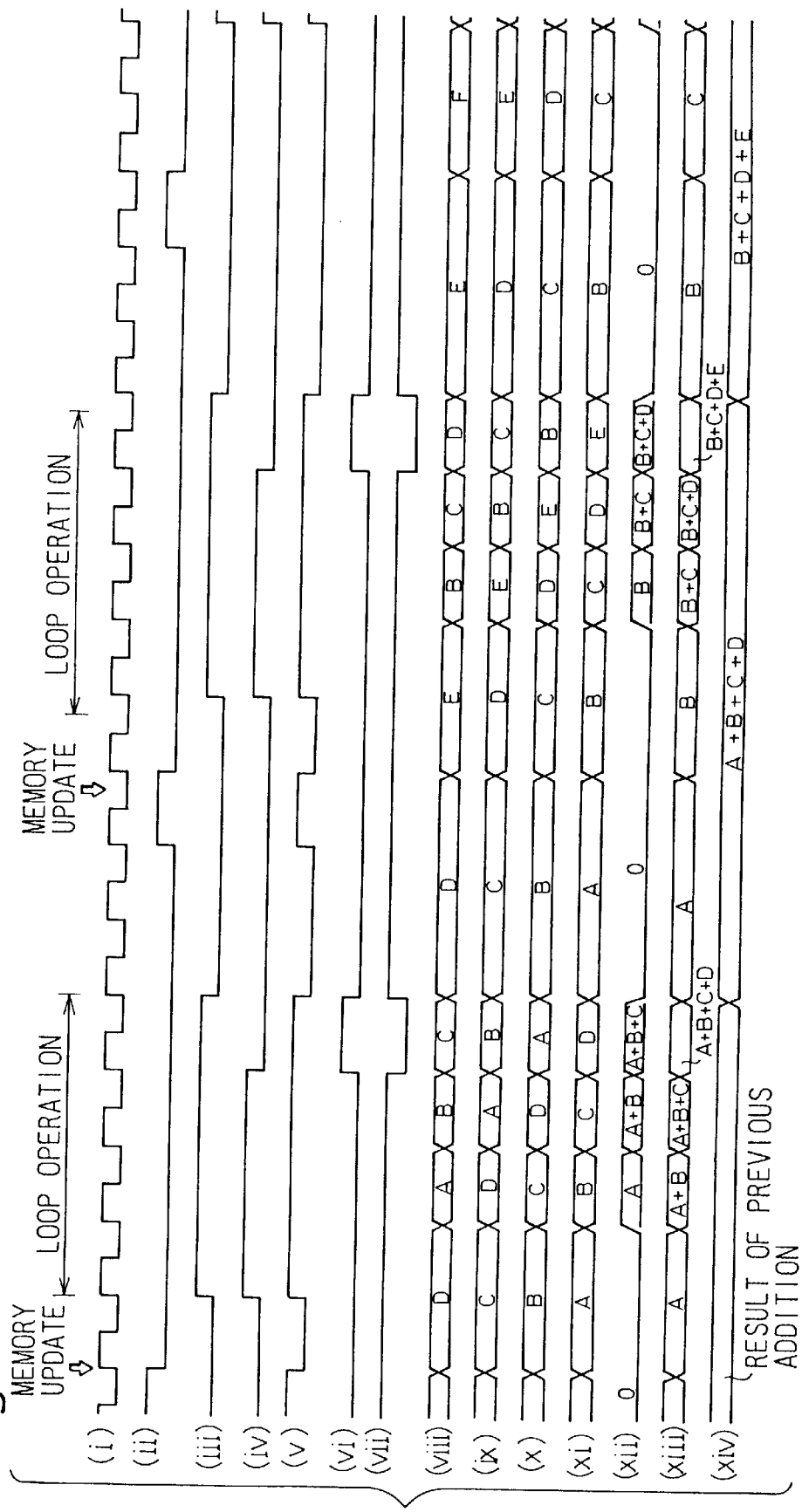
FIG. 10 is a timing chart illustrating the operation of the circuit of FIG. 9.

FIG. 10 is a timing chart for explaining the operation of the moving-average circuit. Signal states at points indicated by reference signs (i) to (xiv) in FIG. 9 are shown in (i) to (xiv) in FIG. 10. The operation of the moving-average circuit of the prevent invention will be described below with reference to FIGS. 9 and 10. It is assumed here that, initially, data "C", "B", and "A" are held in the n-bit latch circuits 80, 82, and 84, respectively, and that the input data is "D". It is also assumed that the n-bit latch circuit 92 is reset and holds data "0". In FIG. 10, when the clock signal (i) goes from Low to high the first time, the loop enable signal (iii) is low and the selector 88, therefore, selects the input data applied at its B input. Since the memory update signal (ii) is high, the output (V) of the OR gate 98 is also high, so that the n-bit latch circuits 80, 82, 84, and 86 are enabled. As a result, the input data "D" is latched into the first-stage n-bit latch circuit 80 by the positive going edge of the clock signal (i), and the data "C", "B", and "A" are shifted into the n-bit latch circuits 82, 84, and 86, respectively. The memory update signal (ii) goes low immediately after the positive going transition of the clock signal. Since "0" is held in the n-bit latch circuit 92 (xii), the adder 90 outputs "A" (xiii). The above is the memory update operation.

A loop operation is initiated at the next positive going transition of the clock signal, immediately after which the loop enable signal (iii) and the shift enable signal (iv) go high and the output of the OR gate 98 returns to high. Now the selector 88 selects the output of the final-stage n-bit latch circuit 86 applied at its A input. The n-bit latch circuit 92 also is enabled. As a result, at the next positive going clock transitions the contents of the latch circuits 80, 82, 84, and 86 are shifted circularly via the selector 88 and the data "B" is output from the final-stage n-bit latch circuit 86. On the other hand, the previous output "A" of the adder 90 is latched in the n-bit latch circuit 92 (xii). As a result, the adder 90 outputs "A+B" (xiii). In this condition, with two more positive going transitions of the clock signal (i), the contents of the latch circuits 80, 82, 84, and 86 are further shifted circularly via the selector 88, and the data "C" and "D" are serially output from the final-stage n-bit latch circuit 92. As a result, the adder 90 outputs "A+B+C+D" (xiii). Almost at the same time, the shift enable signal (iv) goes low to disable the n-bit latch circuit 92; on the other hand, the latch signal (vi) goes high to enable the n-bit latch circuit 94. Further, the reset signal (vii) goes low (active). As a result, at the next positive going clock transition, the output of the adder 90, "A+B+C+D", is latched into the n-bit latch circuit 94 (xiv), while at the same time, the n-bit latch circuit 92 is reset to "0" (xii). After that, when the memory update signal (ii) goes high, at the next positive going clock transition new input data "E" is latched into the first-stage n-bit latch circuit 80. Thereafter, a loop operation similar to the one described above is performed, as a result of which "B+C+D+E" is output from the n-bit latch circuit 94. Then, the output of the n-bit latch circuit 94 is divided by 4 in the divider 96, to obtain the moving-average value of the four successive samples. As previously described, when the number of samples is $2^n$, the divider 96 is not needed.

Figure 11:
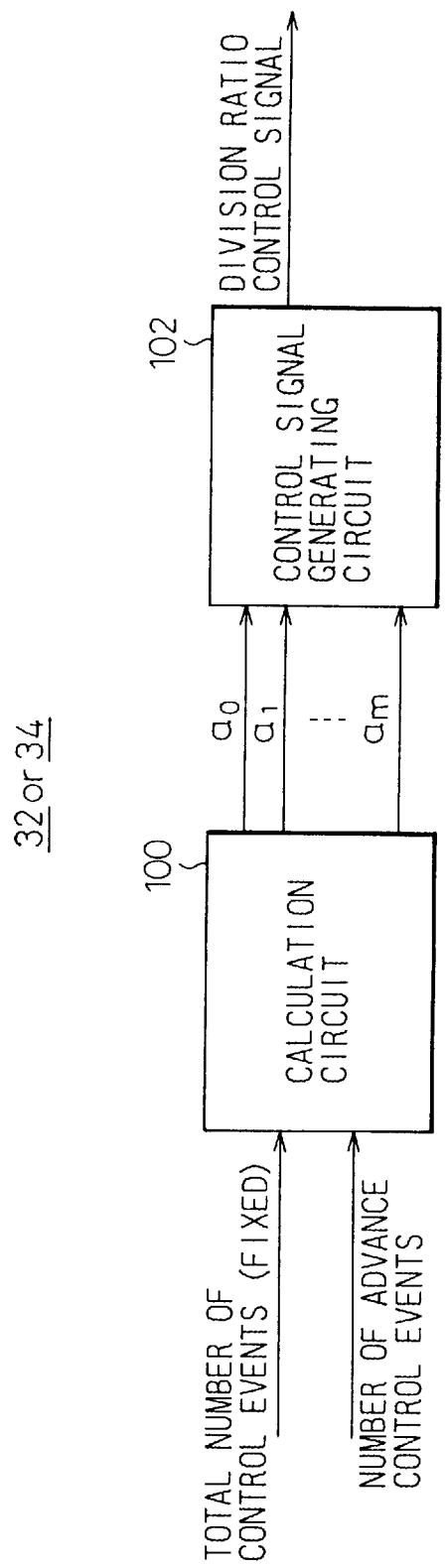
FIG. 11 is a block diagram showing the configuration of a division-ratio equalization circuit according to the present invention.

FIG. 11 shows the configuration of the division-ratio equalization circuit 32 or 34. The number of advance control events is input to a calculating circuit 100 which calculates quotients $a_0, a_1, a_2 \ldots a_m$ when the control value is expressed as (Number of advance control events)/(Total number of control events (fixed value))=$1/(a_0+1/(a_1+1/(a_2+ \ldots +1/a_m))\ldots)$ The quotients $a_0, a_1, a_2 \ldots a_m$ are supplied to a control signal generating circuit 102 which sets the quotients as division ratios in programmable frequency dividers connected in cascade, and provides the frequency-divided output as a division-ratio control signal.

Figure 12:
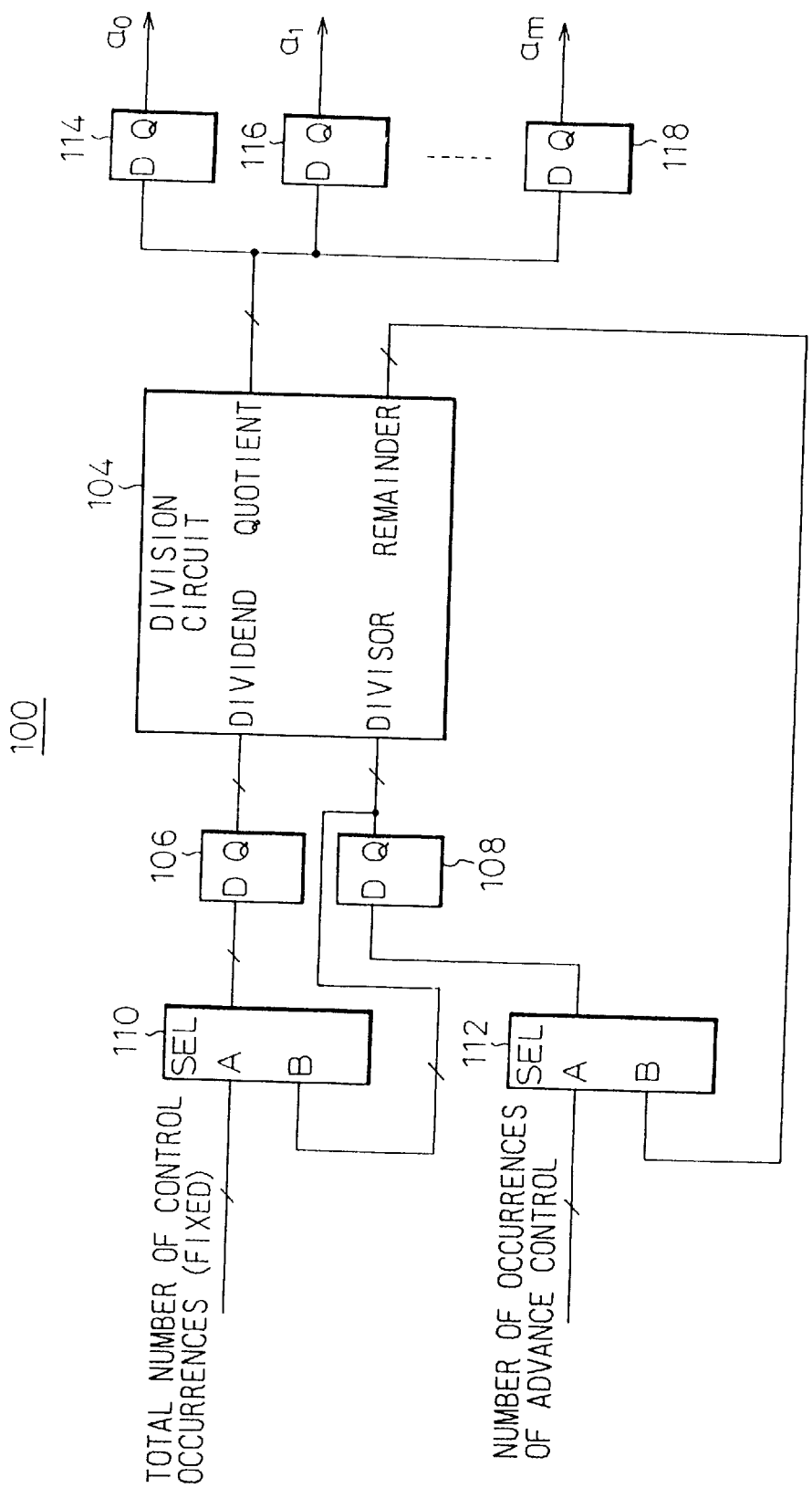
FIG. 12 is a circuit block diagram showing the configuration of a calculating circuit.

FIG. 12 is a diagram showing the configuration of the calculating circuit 100. A dividend input of a division circuit 104 is connected to the output of a latch circuit 106, while a divisor input thereof is connected to the output of a latch circuit 108. The input of the latch circuit 106 is connected to the output of a selector 110, and the input of the latch circuit 108 is connected to the output of a selector 112. The selector 110 selects and outputs one or the other of its two inputs, the total number of control events (fixed value) or the output of the latch circuit 108. The selector 112 selects one or the other of its two inputs, the control value for the number of advance control events or a remainder output of the division circuit 104. A quotient output of the division circuit 104 is connected to latch circuits 114, 116, 118.

The operation of the calculating circuit of FIG. 12 will be described below. Initially, the selectors 110 and 112 select their A inputs, so that the total number of control events and the control value for the number of advance control events are latched in the latch circuits 106 and 108, respectively. The division circuit 104 performs division, the dividend being the total number of control events supplied from the latch circuit 106 and the divisor being the number of advance control events, and outputs the quotient $a_0$ and the remainder. The quotient $a_0$ is latched into the latch circuit 114. Next, the selectors 110 and 112 select their B inputs, and the divisor and remainder from the previous division are latched into the latch circuits 106 and 108 as the dividend and the divisor, respectively. The division circuit 104 performs division using the thus input dividend and divisor, and outputs the quotient $a_1$ and the remainder. The quotient $a_1$ is latched into the latch circuit 116. By repeating this process until the remainder output from the division circuit 104 becomes 0, the quotients $a_0, a_1, a_2 \ldots a_m$ are latched for output. The division circuit 104 may be so constructed as to repeatedly subtract the input divisor from the input dividend until the result becomes a negative number and further subtraction becomes impossible, and to output the number of subtraction operations as the quotient and the final difference as the remainder.

Figure 13:
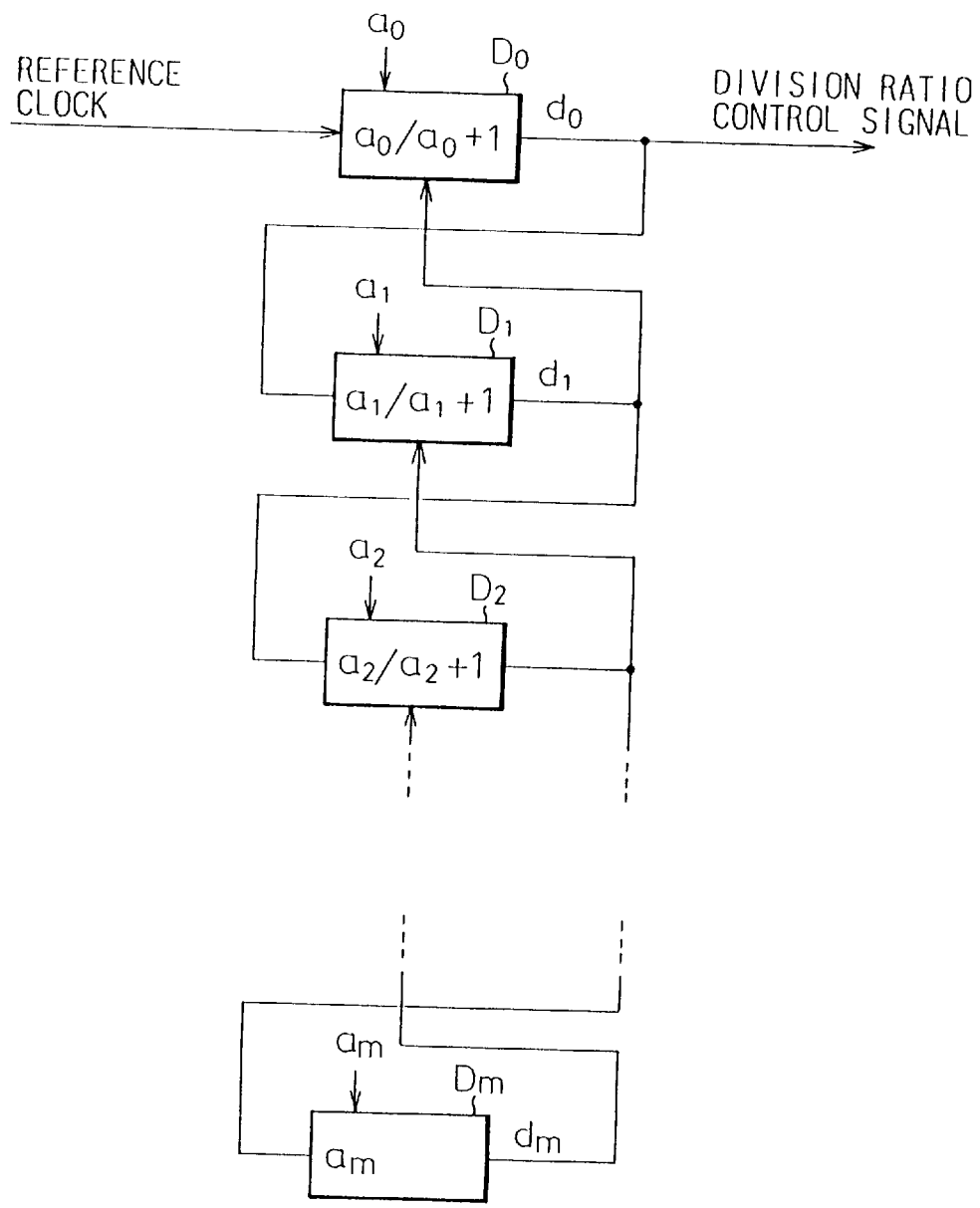
FIG. 13 is a circuit block diagram showing the configuration of a control signal generating circuit.

FIG. 13 illustrates the configuration of the control signal generating circuit 102 shown in FIG. 11. The quotients $a_0, a_1, a_2 \ldots a_m$ from the calculating circuit 100 are set as respective division ratios in the programmable frequency dividers $D_0, D_1, D_2 \ldots D_m$. Since the maximum value of m can be determined when the total number of control events is given, as many programmable frequency dividers as necessary can be provided.

A reference signal is input to the frequency divider $D_0$ in which the quotient $a_0$ is set, and its frequency-divided output $d_0$ is output as the division-ratio control signal. The frequency-divided output $d_0$ is also input to the frequency-divider $D_1$ in which the quotient $a_1$ is set as the division ratio. With the frequency-divided output $d_1$ of the divider $D_1$, the division ratio of the divider $D_0$ is periodically changed from $a_0$ to $a_0+1$. More specifically, during the period that a carry is output after the frequency divider $D_1$ has counted the divide-by value $a_1$ (or $a_1+1$), the division ratio of the frequency divider $D_0$ is changed to $a_0+1$. The frequency-divided output $d_1$ is also input to the frequency divider $D_2$ as an input to be divided. In like manner, the frequency-divided output $d_{i-1}$ of the frequency divider $D_{i-1}$ is input to the frequency divider $D_i$ ($2 \leq i \leq m-1$) with whose frequency-divided output $d_i$ the division ratio of the divider $D_{i-1}$ is periodically changed from $a_{i-1}$ to $a_{i-1}+1$. The frequency-divided output $d_i$ is also input to the frequency divider $D_{i+1}$ as an input to be divided. Likewise for the frequency divider $D_m$, the frequency-divided output $d_{m-1}$ from the frequency divider $D_{m-1}$ is input, but its division ratio $a_m$ remains unchanged until the value of $a_m$ is updated.

The operation of the division-ratio equalization circuit of the present invention will be described below, where for simplicity of explanation it is assumed that the total number of control events is 16 and the control value for the number of advance control events is 7. Hence $$7/16 = 1/(2+1/(3+1/2))$$

Figure 14:
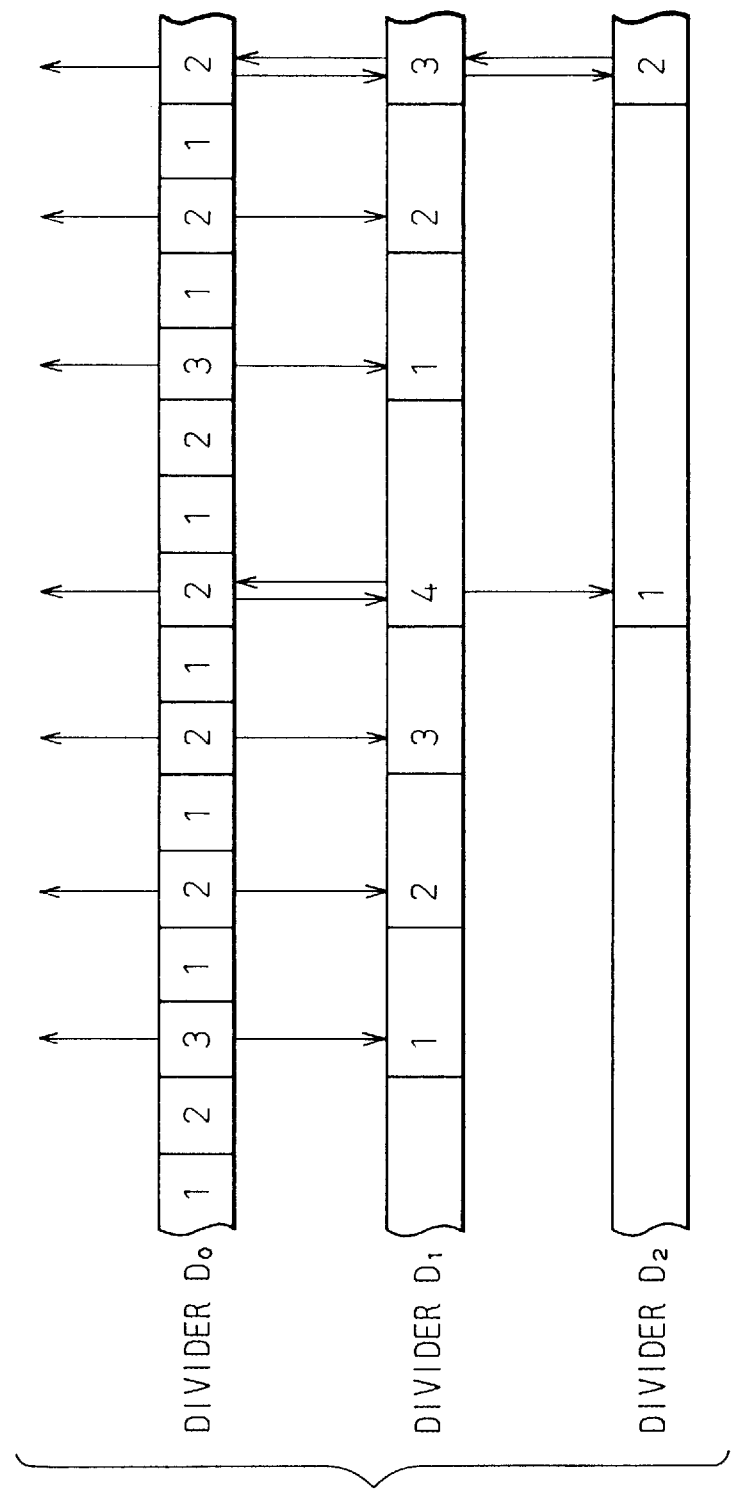
FIG. 14 is a timing chart for explaining the operation of the division-ratio equalization circuit of the present invention.

Therefore, it is determined in the calculating circuit 100 that $a_0=2$, $a_1=3$, and $a_2=2$. In this case, the operation of the control signal generating circuit will be as illustrated in FIG. 14. FIG. 14 shows the transitions of the count values in the dividers $D_0, D_1,$ and $D_2$ immediately after the division ratios in the dividers $D_0$ and $D_1$ have been changed to $a_0+1$ (=3) and $a_1+1$ (=4), respectively. Downward arrows each indicate the generation of a carry upon which the one-stage lower frequency divider counts up, and upward arrows each indicate the generation of a carry upon which the advance control is performed (in the case of the frequency divider $D_0$) or the divide-by value in the one-stage higher frequency divider is increased by 1. FIG. 16 shows only 16 clock cycles, but this pattern is repeated. As can be seen from the figure, the advance control events are uniformly distributed among the 16 control events.

Since the clock signal output from the frequency divider 20 (FIG. 1) is obtained by dividing the input, for example, a 51.84-MHz signal, by 33 or 34, the output clock signal contains jitter equivalent to one phase period (19.29 ns) of 51.84 MHz. However, this jitter consists only of high-frequency components, and therefore, can be eliminated by connecting a band-pass filter or an analog PLL circuit at a subsequent stage.

To prepare for the occurrence of trouble, such as pulse interruptions, to the clock pulses being input to the phase-locked loop oscillator, it is necessary to provide a hold-over function for holding the output clock frequency at the value immediately before the occurrence of trouble. In the phase-locked loop oscillator of the invention, if trouble is detected in the incoming clock signal, the memory contents of the moving-average circuit 16 are prevented from being updated, the operation of the phase comparator 22 is stopped, the output of the gain controller 28 is set to 0, and ±Δfor the final control value is replaced by ±0, to accomplish the hold-over function. To prevent erroneous data from being fed into the moving-average circuit 16, 26 and affecting the control operation in case of a delay in detecting trouble in the input clock signal, it is desirable that a protective memory array with a required number of stages be inserted in the moving-average circuit 16, 26 before the moving-average memory.

The above description has been given on the assumption that all component elements of the phase-locked loop oscillator are implemented in hardware, but it will be recognized that part of the construction may be replaced by a processor and software describing its execution procedures. Furthermore, all the component elements need not necessarily be implemented on a single LSI chip or in a single unit, but may be arranged as separate component parts.

What is claimed is:

1. A phase-locked loop oscillator comprising:
    means for obtaining a first digital value indicating a mean frequency of an input signal;
    means for obtaining a second digital value indicating a mean phase difference of an output signal relative to said input signal;
    means for calculating a control value on the basis of said first and said second digital values;
    means for selecting a division ratio from two division ratios in accordance with a control signal;
    a dual-modulus frequency divider for generating said output signal by frequency-dividing a reference signal, said frequency divider being capable of operating with the division ratio selected; by said selecting means and
    frequency divider control signal generating means for generating said control signal for controlling said dual-modulus frequency divider in accordance with said control value.

2. A phase-locked loop oscillator according to claim 1, further comprising synchronization condition judging means for judging whether said output signal is in a synchronized condition or in an out-of-synchronization condition with respect to said input signal, wherein
    said control value calculating means calculates said control value based only on said first digital value as long as said synchronization condition judging means judges the condition to be an out-of-synchronization condition.

3. A phase-locked loop oscillator according to claim 2, wherein said control value calculating means determines said control value by using said second digital value rather than said first digital value as long as said synchronization condition judging means judges the condition to be a synchronized condition.

4. A phase-locked loop oscillator according to claim 3, wherein said control value calculating means includes;
    a center control value determining means for determining a center control value in such a manner that said center control value progressively approaches said first digital value; and
    an adding means for adding a value based on said second digital value to the center control value determined by said center control value determining means.

5. A phase-locked loop oscillator according to claim 4, wherein said means for obtaining said second digital value includes;
    a phase comparator for outputting a signal indicating a phase difference between said input signal and said output signal;
    a phase difference measuring circuit for measuring the phase difference between said input signal and said output signal on the basis of the signal output from said phase comparator; and
    a moving-average circuit for obtaining said second digital value by taking the moving average of phase difference values measured by said phase difference measuring circuit.

6. A phase-locked loop oscillator according to claim 5, wherein said moving-average circuit includes;
    a storage circuit for storing a predetermined number of successive numeric values, and for outputting in sequence all the numeric values stored therein each time the stored contents thereof are updated with entry of a new numeric value; and
    an accumulator circuit for successively adding up the numeric values serially output from said storage circuit, said accumulator circuit being cleared when the stored contents of said storage circuit are updated.

7. A phase-locked loop oscillator according to claim 5, wherein said synchronization condition judging means judges the condition to be a synchronized condition when the difference between said first digital value and said center control value is within a predetermined range, and to be an out-of-synchronization condition when said measured phase difference value is greater than a predetermined value or when said second digital value is greater than a predetermined value.

8. A phase-locked loop oscillator according to claim 5, wherein a number of moving-average samples in said moving-average circuit is changed in accordance with the phase difference value measured by said phase difference measuring circuit.

9. A phase-locked loop oscillator according to claim 1, wherein said frequency divider control signal generating means includes;
    multiple control signal generating means for generating multiple control signals from said control value; and
    a selector for selecting one of said multiple control signals on the basis of said second digital value and for supplying said selected control signal to said dual-modulus frequency divider.

10. A phase-locked loop oscillator according to claim 9, wherein said multiple control signal generating means comprises;
    a calculating circuit that, from the input control value, successively calculates quotients $a_0, a_1, a_2 \ldots a_m$ for output, when said control value is expressed as $1/(a_0+1/(a_1+1/(a_2+ \ldots +1/a_m)) \ldots )$; and
    a control signal generating circuit that includes a cascaded chain of a plurality of programmable frequency dividers in which said plurality of quotients $a_0, a_1, a_2 \ldots a_m$ are set as respective division ratios, and that frequency-divides a reference signal through the cascaded chain of said plurality of programmable frequency dividers and outputs the result as said control signal.

11. A phase-locked loop oscillator according to claim 10, wherein said calculating circuit first calculates the quotient $a_0$ by dividing the denominator of a fraction, corresponding to said control value, by the numerator thereof, and then successively calculates the quotients $a_1, a_2 \ldots a_m$ by repeating the process of dividing the previous divisor by the previous remainder until the remainder becomes zero.

12. A phase-locked loop oscillator according to claim 10, wherein said control signal generating circuit includes a plurality of programmable frequency dividers $D_0, D_1 \ldots D_m$ in which the quotients $a_0, a_1 \ldots a_m$ output from said calculating circuit are set as respective division ratios, the operation of said control signal generating circuit being such that the frequency divider $D_0$ frequency-divides the reference signal and outputs the resulting frequency-divided output $d_0$ as said control signal, that a frequency divider $D_i$, where i is an integer larger than 1 and smaller than m−1, frequency-divides a frequency-divided output $d_{i-1}$ of a frequency divider $D_{i-1}$ and supplies the resulting frequency-divided output $d_i$ to a frequency divider $D_{i+1}$ while periodically changing the division ratio of the frequency divider $D_{i-1}$ to $a_{i-1}+1$ with said frequency-divided output $d_i$, and that the frequency divider $D_m$ frequency-divides a frequency-divided output $d_{m-1}$ of a frequency divider $D_{m-1}$ and periodically changes the division ratio of the frequency divider $D_{m-1}$ with the resulting frequency-divided output $d_m$.

13. A phase-locked loop oscillator according to claim 11, wherein said calculating circuit includes;
   a divider circuit for dividing a dividend by a divisor and outputting a quotient and a remainder;
   a first latch circuit for latching an input numeric value and outputting the same as a dividend to said divider circuit;
   a second latch circuit for latching an input numeric value and outputting the same as a divisor to said divider circuit,
   a first selector circuit for selecting one or the other of two inputs, the value of said denominator or the output of said second latch circuit, for supply to said first latch circuit; and
   a second selector circuit for selecting one or the other of two inputs, the value of said numerator or the remainder output of said divider circuit, for supply to said second latch circuit.

14. A moving-average circuit comprising;
   a storage circuit for storing a predetermined number of successive numeric values, and for individually and serially outputting all the numeric values stored therein each time the stored contents thereof are updated with entry of a new numeric value; and
   a single accumulator circuit for successively adding up the numeric values serially output from said storage circuit, said accumulator circuit being cleared when the stored contents of said storage circuit is updated,
   wherein said storage circuit has;
   a data holding circuit including a plurality of data latch circuits connected in series, each for latching and outputting an input numeric value, a number of said data latch circuits being equal to said predetermined number of numeric values; and
   a selector circuit for selecting a new numeric value for input to said data holding circuit when updating the stored contents of said storage circuit, and selecting an output of said data holding circuit for input to said data holding circuit when sequentially outputting the numeric values stored in said storage circuit.

15. A moving-average circuit according to claim 14, wherein said accumulator circuit includes;
   a data latch circuit for latching and outputting an input numeric value, said data latch circuit being cleared when the stored contents of said storage circuit is updated; and
   an adder circuit for adding together the numeric values output from said storage circuit and said data latch circuit and for applying the result of the addition to an input of said data latch circuit.

16. A division-ratio equalization circuit for generating a control signal by which a dual-modulus frequency divider, capable of operating with a division ratio selected from two division ratios in accordance with a control signal and controlled so that the division ratio is equally distributed along the time axis in accordance with an input control value, comprising;
   a calculating circuit that, from the input control value, successively calculates quotients $a_0, a_1, a_2 \ldots a_m$ for output, when said control value is expressed as $1/(a_0 + 1/(a_1 + 1/(a_2 + \ldots + 1/a_m)) \ldots )$; and
   a control signal generating circuit that includes a cascaded chain of a plurality of programmable frequency dividers in which said plurality of quotients $a_0, a_1, a_2 \ldots a_m$ are set as respective division ratios, and that frequency-divides a reference signal through the cascaded chain of said plurality of programmable frequency dividers and outputs the result as said control signal.

17. A division-ratio equalization circuit according to claim 16, wherein said calculating circuit first calculates the quotient $a_0$ by dividing the denominator of a fraction, corresponding to said control value, by the numerator thereof, and then successively calculates the quotients $a_1, a_2 \ldots a_m$ by repeating the process of dividing the previous divisor by the previous remainder until the remainder becomes zero.

18. A division-ratio equalization circuit according to claim 16, wherein said control signal generating circuit includes a plurality of programmable frequency dividers $D_0, D_1 \ldots D_m$ in which the quotients $a_0, a_1 \ldots a_m$ output from said calculating circuit are set as respective division ratios, the operation of said control signal generating circuit being such that the frequency divider $D_0$ frequency-divides the reference signal and outputs the resulting frequency-divided output $d_0$ as said control signal, that a frequency divider $D_i$, where i is an integer larger than 1 and smaller than m−1, frequency-divides a frequency-divided output $d_{i-1}$ of a frequency divider $D_{i-1}$ and supplies the resulting frequency-divided output $d_i$ to a frequency divider $D_{i+1}$ while periodically changing the division ratio of the frequency divider $D_{i-1}$ to $a_{i-1}+1$ with said frequency-divided output $d_i$, and that the frequency divider $D_m$ frequency-divides a frequency-divided output $d_{m-1}$ of a frequency divider $D_{m-1}$ and periodically changes the division ratio of the frequency divider $D_{m-1}$ with the resulting frequency-divided output $d_m$.

19. A division-ratio equalization circuit according to claim 18, wherein said calculating circuit includes;

a divider circuit for dividing a dividend by a divisor and outputting a quotient and a remainder;

a first latch circuit for latching an input numeric value and outputting the same as a dividend to said divider circuit, a second latch circuit for latching an input numeric value and outputting the same as a divisor to said divider circuit, a first selector circuit for selecting one or the other of two inputs, the value of said denominator or the output of said second latch circuit, for supply to said first latch circuit; and a second selector circuit for selecting one or the other of two inputs, the value of said numerator or the remainder output of said divider circuit, for supply to said second latch circuit.

* * * * *